United States Patent
Radens et al.

(10) Patent No.: US 6,265,279 B1
(45) Date of Patent: Jul. 24, 2001

(54) METHOD FOR FABRICATING A TRENCH CAPACITOR

(75) Inventors: Carl Radens, Poughkeepsie; Jack A. Mandelman, Stormville, both of NY (US); Joachim Hoepfner, Planegg (DE)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/404,906

(22) Filed: Sep. 24, 1999

(51) Int. Cl.⁷ ................................................. H01L 21/20
(52) U.S. Cl. ........................ 438/386; 438/389; 438/246
(58) Field of Search ................................. 438/243, 244, 438/245, 246, 247, 249, 386, 387, 389, 390, 392

(56) References Cited

U.S. PATENT DOCUMENTS

| | | | |
|---|---|---|---|
| 4,466,178 | * | 8/1984 | Soclof . |
| 5,013,673 | * | 5/1991 | Fuse . |
| 5,376,575 | * | 12/1994 | Kim et al . |
| 5,981,332 | * | 11/1999 | Mandelman et al. ................ 438/246 |
| 6,107,153 | * | 8/2000 | Huang et al. ........................ 438/389 |

FOREIGN PATENT DOCUMENTS

| | | | |
|---|---|---|---|
| 0 234244 | * | 9/1987 | (EP) . |
| 1-256123 | * | 10/1989 | (JP) . |
| 3-148818 | * | 6/1991 | (JP) . |

OTHER PUBLICATIONS

Kato, "As–Ion–Implantation Simulation for Trench Structures Using a Mote Carlo Method", IEEE Transactions On Electron Devices, vol. 35, No. 11, Nov. 1988, pp. 1820–1828.*

* cited by examiner

Primary Examiner—Tuan H. Nguyen
(74) Attorney, Agent, or Firm—Stanton C. Braden

(57) ABSTRACT

A trench capacitor, in accordance with the present invention, includes a trench formed in a substrate. The trench has a buried plate formed adjacent to a lower portion of the trench. A dielectric collar is formed along vertical sidewalls of the trench. A node diffusion region is formed adjacent to the trench for connecting to a storage node in the trench. A dopant region is formed laterally outward from the trench and adjacent to the collar, and the dopant region includes a profile having a lower portion extending further laterally outward from the trench than an upper portion of the profile wherein operation of a parasitic transistor formed adjacent to the trench between the node diffusion and the buried plate is disrupted by the dopant region. Methods for forming the dopant region are also disclosed and claimed.

23 Claims, 5 Drawing Sheets

METHOD FOR FABRICATING A TRENCH CAPACITOR

BACKGROUND

1. Technical Field

This disclosure relates to semiconductor memories and more particularly, to a trench capacitor semiconductor memory with retrograded doping along a trench sidewall to prevent parasitic leakage.

2. Description of the Related Art

Integrated circuits (ICs) employ capacitors for charge storage purposes. For example, memory devices, including random access memories (RAMS) such as dynamic RAMs (DRAMs) store a charge in a capacitor. The level of charge ("0" or "1") in the capacitor represents a bit of data.

A DRAM IC includes an array of memory cells interconnected by rows and columns. Typically, the row and column connections are referred to as wordlines and bitlines, respectively. Reading data from or writing data to the memory cells is accomplished by activating the appropriate wordlines and bitlines.

Typically, a DRAM memory cell comprises a metal oxide semiconductor field effect transistor (MOSFET) connected to a capacitor. The transistor includes a gate and first and second diffusion regions. The first and second diffusion regions are referred to either as the drain and the source, respectively, depending on the operation of the transistor. For convenience, the terms drain and source are interchangeable. The gate of the transistor is coupled to a wordline, and a first diffusion region is coupled to a bitline. A second diffusion region of the transistor is coupled to the capacitor or storage node. Applying the appropriate voltage to the gate switches on the transistor, forms a conductive path to the capacitor. This conductive path is closed when the transistor is switched off.

A trench capacitor for a memory device is a three-dimensional structure formed into a silicon substrate. A conventional trench capacitor includes a trench etched into the substrate. The trench is typically filled with n+ doped polysilicon which serves as one plate of the capacitor (i.e., storage node). The second plate of the capacitor, referred to as a buried plate, is formed by, for example, outdiffusing n+ dopants from a dopant source into regions of the substrate surrounding the lower portion of the trench. A dielectric layer is provided to separate the two plates forming the capacitor. To prevent or reduce parasitic leakage that occurs along the upper portion of the trench to an acceptable level, an oxide collar of sufficient thickness is provided in the trench. Typically, the oxide is thick enough to reduce the current leakage to less than about 1fA/cell.

Continued demand to shrink devices has facilitated the design of DRAMs with greater density and smaller feature size and cell area. For example, design rules have been scaled down to 0.12 microns and below. At the smaller groundrules, the control of vertical parasitic MOSFET leakage between the storage node diffusion and the buried plate becomes problematic due to the smaller trench dimensions. The smaller trench opening necessitates a corresponding reduction in collar thickness to facilitate filling the trench with storage node material. To reduce the parasitic leakage to below an acceptable level, the thickness of the collar needs to be about 20–90 nm, depending on the operating voltage conditions. Such a thick collar hinders the filling of the smaller diameter trench.

One way to reduce parasitic leakage is to increase dopant concentration of a well on which the transistor for the memory cell is formed. However, raising the dopant concentration of the well increases electric fields in depletion regions, which results in a sharp increase in junction leakage. This is especially true when crystallographic defects are present in the silicon.

Referring to FIG. 1, a conventional trench capacitor cell 100 is shown employing an n-channel MOSFET. The conventional trench capacitor cell 100 is typically part of an array of cells interconnected by wordlines and bitlines on a semiconductor chip.

Cell 100 includes a trench capacitor 160 formed in a substrate 101. The trench is typically filled with polysilicon (poly) to form a storage node 161 that is doped with n-dopants. Buried plate 165 is also doped with n-type dopants and surrounds the lower portion of the trench. In the upper portion of the trench, a collar 168 is formed to reduce parasitic leakage. A node dielectric 163 separates storage node 161 and buried plate 165. A buried well 170 includes n-type dopants and is provided to connect buried plates 165 in the array of cells 100. A p-well 173 is above buried well 170.

A transistor 110 is provided which includes a gate 112, a source 113 and a drain 114 diffusion regions including n-type dopants. The source 113 and drain 114 may be interchanged depending on the operation of transistor 110. Gate 112 represents a wordline for activating transistor 110 (active wordline). Connection of transistor 110 to storage node 161 is achieved through buried strap 125 and diffusion region 114.

A shallow trench isolation (STI) 180 is provided to isolate cell 100 from other cells or devices. A wordline 120 may be formed over the trench, and wordline 120 is isolated from the trench by STI 180. Wordline 120 is referred to as a passing wordline. This configuration is referred to as a folded bitline architecture.

An interlevel dielectric layer 189 is formed over the wordlines. A conductive layer, representing a bitline 190 is formed over interlevel dielectric layer 189. A bitline contact 186 is provided through interlevel dielectric layer 189 to connect diffusion 113 to bitline 190.

As described previously, smaller groundrules which produce smaller trench dimensions require thinner collars. However, thinner collars may be inadequate to prevent excessive parasitic leakage. A vertical parasitic transistor 122 is formed on the sidewall of the trench. Parasitic transistor 122 includes buried strap diffusion 125 and buried plate 165 as its drain and source (respectively). When an appropriate charge is stored within the trench, collar 168 acts as a gate oxide and storage node 161 acts as a gate conductor. A channel is formed in substrate 101 adjacent to the trench and within p-well 173. This vertical parasitic transistor is highly undesirable and results in loss of stored charge from the capacitor.

Therefore, a need exists for a method for reducing parasitic transistors in trench capacitors without increasing the thickness of a dielectric collar formed in the trench.

SUMMARY OF THE INVENTION

A trench capacitor, in accordance with he present invention, includes a trench formed in a substrate. The trench has a buried plate formed adjacent to a lower portion of the trench. A dielectric collar is formed along vertical sidewalls of the trench. A node diffusion region is formed adjacent to the trench for connecting to a storage node in the trench. A dopant region is formed laterally outward from the trench and adjacent to the collar, and the dopant region includes a profile having a lower portion extending further laterally outward from the trench than an upper portion of the profile wherein operation of a parasitic transistor formed adjacent to the trench between the node diffusion and the buried plate is disrupted by the dopant region.

In alternate embodiments, the dopant region may include a conical shape wherein the upper portion of the profile forms an apex of the conical shape. The collar may include a thickness of less than 20 nm. The dopant region may be asymmetrical about the trench.

A method for fabricating a trench capacitor, in accordance with the present invention, includes providing a substrate with a trench formed in the substrate, the trench having a buried plate formed adjacent to the trench and forming a conductive material in the trench. The conductive material is recessed to a first position within the trench. Dopants are implanted in sidewalls of the trench such that a dopant region is formed laterally outward from the trench. The dopant region includes a profile having a lower portion at about the first position extending further laterally outward from the trench than an upper portion of the profile wherein operation of a parasitic transistor formed adjacent to the trench is disrupted by the dopant region. A dielectric collar and a storage node are formed in the trench.

In a trench capacitor cell, which may form a parasitic transistor between a buried plate and a node diffusion which is enabled by charge stored in a storage node, a method for disrupting the parasitic transistor, in accordance with the present invention, includes forming a conductive material in the trench and recessing the conductive material to a first position within the trench. Dopants are implanted in sidewalls of the trench such that a dopant region is formed laterally outward from the trench. The dopant region includes a profile having a lower portion at about the first position extending further laterally outward from the trench than an upper portion of the profile wherein operation of a parasitic transistor formed adjacent to the trench is disrupted by the dopant region.

In another trench capacitor cell, which may form a parasitic transistor between a buried plate and a node diffusion which is enabled by charge stored in a storage node, a method for disrupting the parasitic transistor, in accordance with the present invention, includes recessing a trench into a substrate down to a first position within the substrate, and implanting dopants in sidewalls of the trench such that a dopant region is formed laterally outward from the trench. The dopant region includes a profile having a lower portion at about the first position extending further laterally outward from the trench than an upper portion of the profile wherein operation of a parasitic transistor formed adjacent to the trench is disrupted by the dopant region. The trench is extended to a second position which is deeper into the substrate.

In other methods, the step of implanting dopants may include the step of implanting dopants by one of plasma immersion ion implantation and plasma doping. The step of implanting dopants by one of plasma immersion ion implantation and plasma doping may include the step of adjusting chamber parameters of a processing chamber, the chamber parameters including at least one of pressure in the chamber, voltage difference between a chamber electrode and the substrate and a geometric orientation of the substrate relative to a dopant source in the chamber. The pressure may be adjusted to between about 1 mTorr and about 500 mTorr, the voltage difference may be adjusted to between about 500 volts and about 10,000 volts, and the geometric orientation may include a tilt angle of between about 3 degrees and about 30 degrees. The method may further include the steps of forming a node dielectric on the trench sidewalls and stripping the node dielectric above the first position prior to the step of implanting. The profile may includes a conically shaped diffusion region having an apex at the upper portion.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention includes methods for forming a retrograded dopant region adjacent to dielectric collars for deep trench capacitors. The dopant profile is preferably controlled by employing dopant implantation methods which provide the capability of shaping or contouring the dopant profile along the trench walls. As described above, vertical parasitic transistors form on sidewalls of storage trenches due to the different dopant regions employed in a trench capacitor cell. The present invention advantageously provides a retrograde or shaped dopant profile to disrupt channel formation of a parasitic transistor along a sidewall of the trench.

Figure 2:
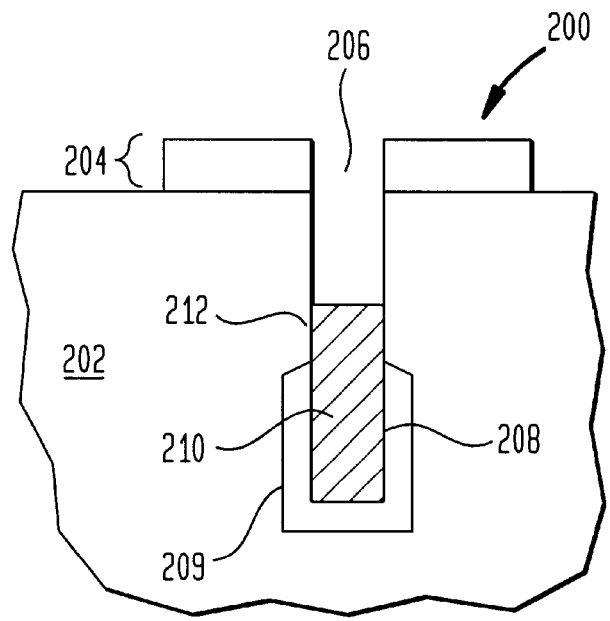
FIG. 2 is a cross-sectional view of a trench capacitor cell showing a conductive material recessed in a trench in accordance with the present invention.

Referring now in specific detail to the drawings in which like reference numerals identify similar or identical elements throughout the several views, and initially to FIG. 2, a trench capacitor memory cell 200 is illustratively shown. A substrate 202 includes a pad stack 204 formed thereon. Substrate 202 illustratively includes a p-substrate; however n-substrates may be used by appropriately changing conductivities. Pad stack 204 may include one or more layers of dielectric materials, such oxides and nitrides. Pad stack 204 has been patterned preferably using a resist layer and photolithographic techniques known to those skilled in the art. Pad stack 204 is opened at locations where trenches 206 are to be placed. Trenches 206 are formed by etching substrate 202 through pad stack 204. Trenches 206 are preferably formed using a reactive ion etch (RIE) process. A buried plate diffusion 209 is formed in a lower portion of trench 206 by employing methods known to those skilled in the art.

Figure 1:
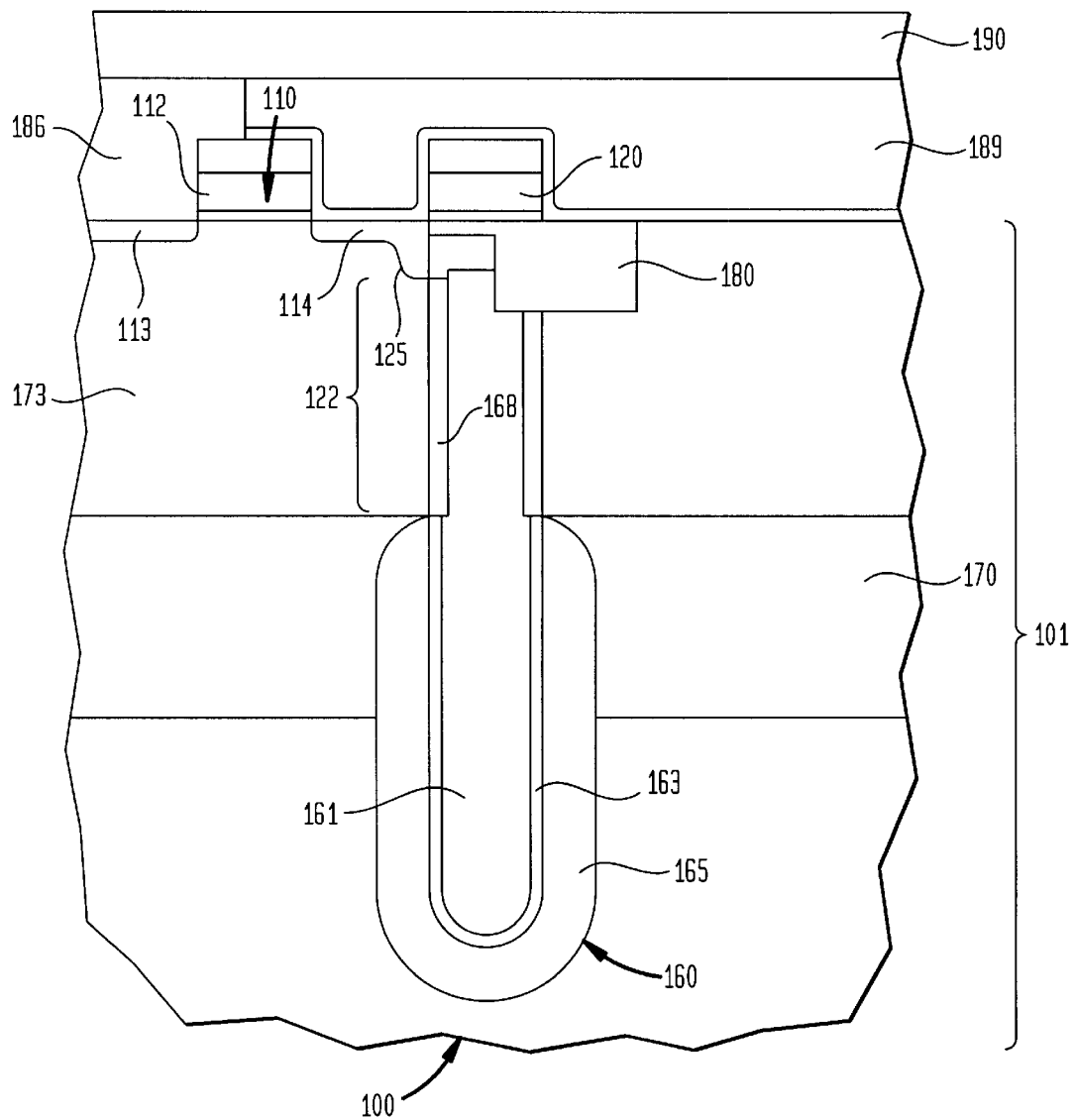
FIG. 1 is a cross-sectional view of a conventional trench capacitor cell.

A node dielectric layer 208 is formed along surfaces of trench 206. Node dielectric 208 preferably includes a nitride material, such as silicon nitride. Trench 206 is then filled with a conductive material 210, such as n-doped polysilicon to form a storage node. Material 210 is recessed to a position 212 preferably by a dry etch. Position 212 is preferably at an approximate location where a dielectric collar is to be formed in later steps (e.g., between diffusion 114 and buried well 170 (see FIG. 1)). This ensures dopant implantations in accordance with the present invention which substantially coincide with the location of the dielectric collar. In one embodiment, material 210 is recessed to a depth of approximately 0.7 microns relative to a top surface of substrate 202.

Figure 3:
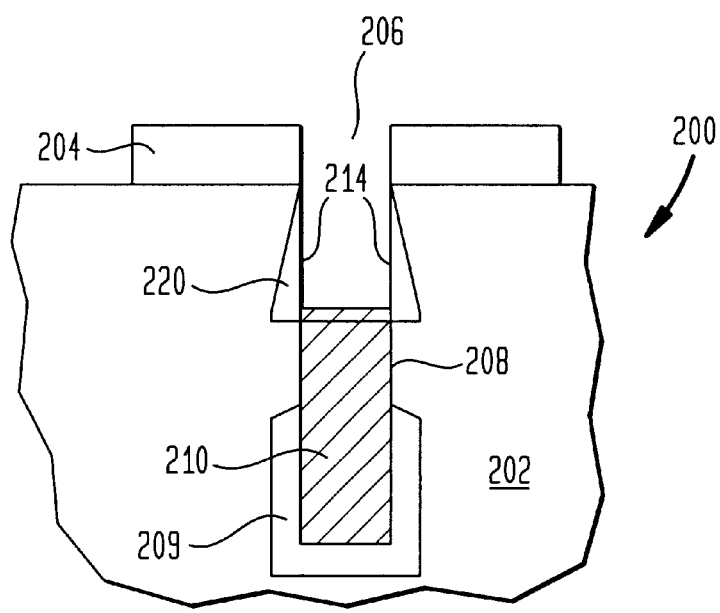
FIG. 3 is a cross-sectional view of the trench capacitor cell of FIG. 2 showing a dopant region formed in accordance with the present invention.

Referring to FIG. 3, retrograde doping of trench sidewalls 214 is performed in accordance with the present invention. In preferred embodiments, Plasma Immersion Ion Implantation (PIII) or Plasma Doping (PLAD) may be used to introduce doping impurities into the sidewalls 214 of trench 206. Advantageously, in accordance with the present invention, retrograde doping profiles with increased doping levels at a lower position in trench 206 may be realized by controlling the pressure, electrode voltage of the implantation tool, and PLAD/PIII system geometry. In PIII/PLAD processes, a silicon wafer is placed directly in a plasma including the desired dopant ions and then pulse biased to a negative potential to accelerate positive dopant ions into a substrate. In this process, the energy and dose of implanted ions can be controlled by the bias voltage and time averaged changes. In preferred embodiments, the pressure is maintained between about 1 mTorr and about 5 Torr, preferably between about 1 mTorr to about 500 mTorr. The voltage difference between a plasma chamber wall (usually at ground potential) of the implantation tool and the substrate is preferably maintained between about 500 volts and about 10,000 volts. The PLAD/PIII system geometry (chamber geometry) may be altered to provide dopants at an angle relative to trench sidewalls 214, for example, between about 0☐ and about 35☐. A dopant region 220 is formed in sidewalls 214 of trench 206. Node dielectric 208 may be removed from sidewalls 214 above material 210 to improve implantation of dopants in sidewalls 214.

Figure 4:
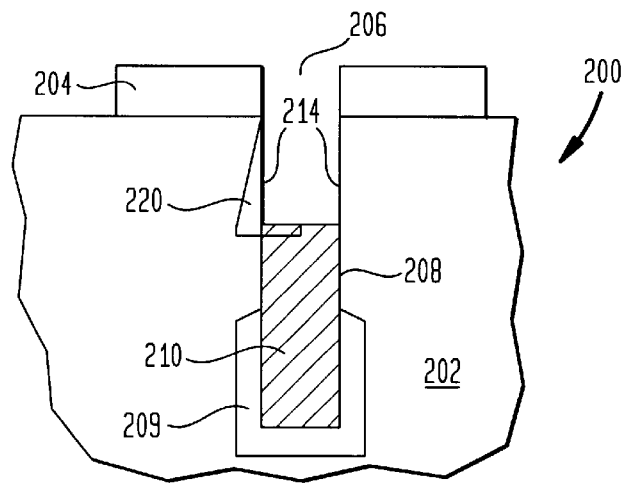
FIG. 4 is a cross-sectional view of the trench capacitor cell of FIG. 2 showing an asymmetrical dopant region formed in accordance with the present invention.
Figure 5A:
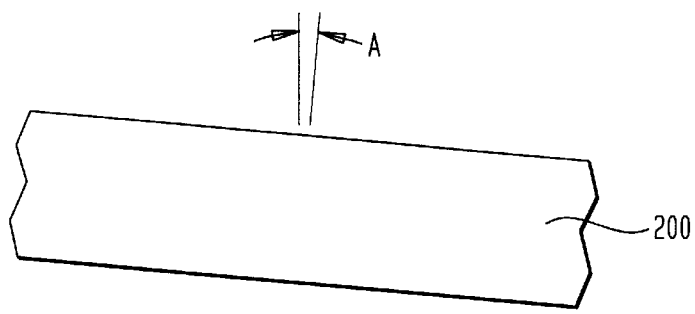
FIG. 5A is a side view of a device showing a tilt angle in accordance with the present invention.
Figure 5B:
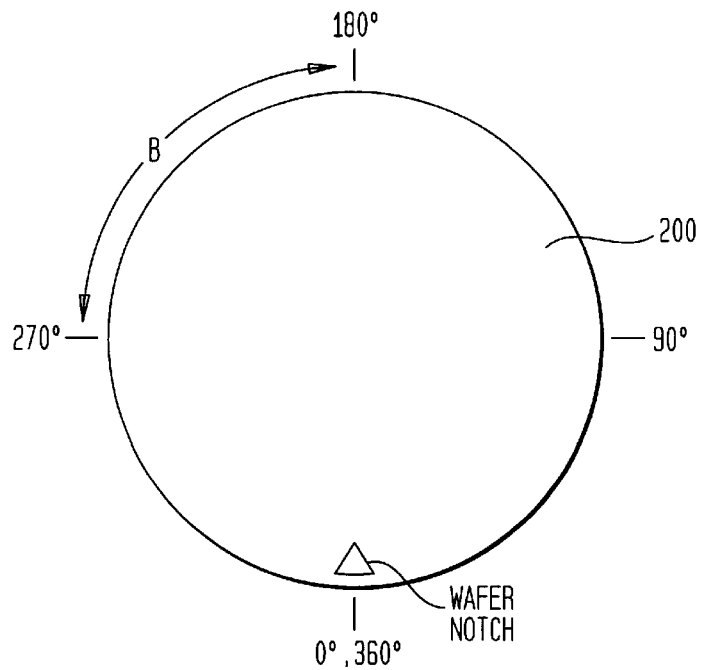
FIG. 5B is a top view of a device showing a rotation angle in accordance with the present invention.

PIII/PLAD methods provide control for sidewall doping profiles along the depth of trench 206. PIII/PLAD methods eliminate the need for rotating stages and, or multiple-pass angle beam-line implants needed for conventional processes. In accordance with the present invention, doping parameters may be modified to provide different shapes or contours for dopant region 220. In addition angled implantation may be provided by multiple pass and rotating stage techniques for dopant implantation in the sidewalls of trench 206. As shown in FIG. 3, a conical doping profile is provided for dopant region. However, other dopant profiles may be achieved, for example, multiple cones, parabolic profiles, hyperbolic profiles, etc. Alternately, dopant profiles 221 may be biased to one side of a trench as shown in FIG. 4 using angled implantation techniques (e.g., tilted ion implantation). FIGS. 5A and 5B, respectively show a tilt angle "A" relative to a top surface 270 of semiconductor device 200 and a rotation angle "B" relative to a top view of device 200. In one embodiment of the present invention, angled implantation includes employing a tilt angle from between about 0 degrees to about 35 degrees and a rotation angle of about 0 degrees to about 270 degrees as measured from a datum (e.g., a wafer notch).

It is to be understood that doping profile may be altered after implanted into substrate 202. This may be achieved by diffusing the dopants further into substrate 202. For example, an annealing process may be employed to drive dopants laterally into substrate 202.

Figure 6A:
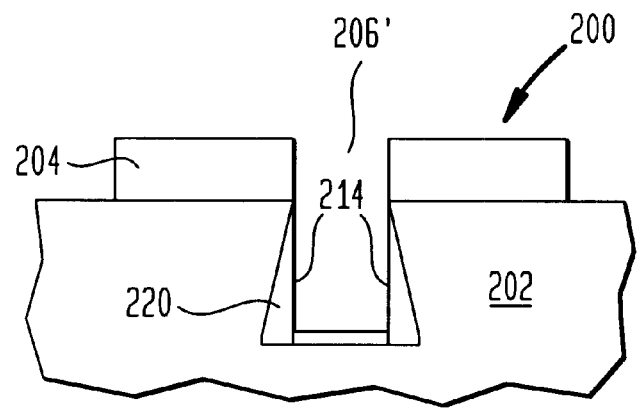
FIG. 6A is a cross-sectional view of a trench capacitor cell showing a substrate recessed and a retrograded dopant profile formed in accordance with the present invention.
Figure 6B:
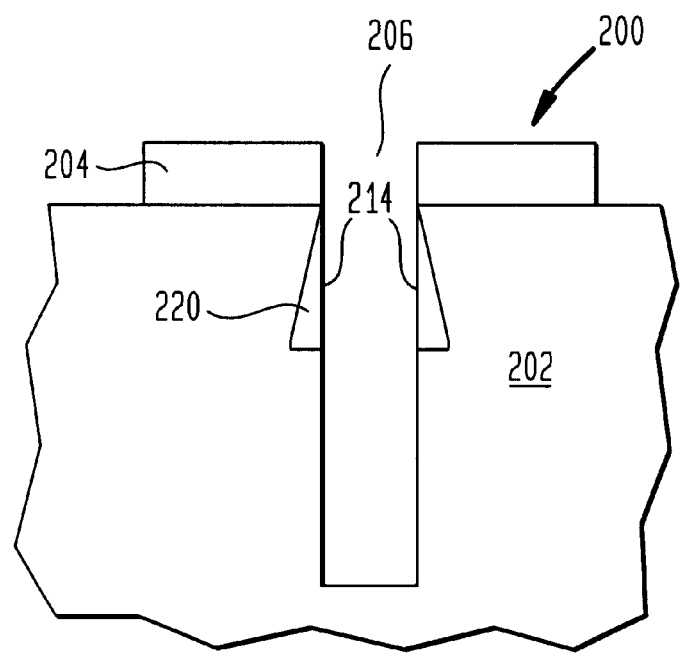
FIG. 6B is a cross-sectional view of the trench capacitor cell of FIG. 6A showing the substrate recessed to form a trench of full depth in accordance with the present invention.

Referring to FIGS. 6A and 6B, an alternate method for retrograde doping is shown. Substrate 202 is recessed to form a first trench 206'. A dopant profile 220 is now formed as described above by, for example, PIII/PLAD. As shown in FIG. 6B, trench 206 is now completed. An annealing step may be employed as well to drive dopants further into substrate 202 preferably laterally outward from trench (206' or 206).

Figure 7:
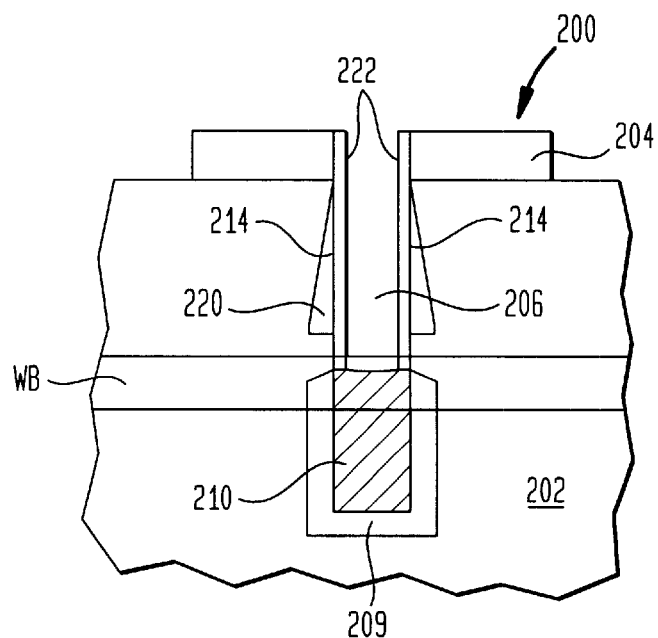
FIG. 7 is a cross-sectional view of the trench capacitor cell of FIG. 3 showing conductive material recessed and a collar formed in accordance with the present invention.

Referring to FIG. 7, material 210 is recessed to a complete collar depth (i.e., where the lowest portion of a dielectric collar 222 is to be formed, for example at a depth from a top surface of substrate 202 of about 1.3 microns). If node dielectric 208 was stripped prior to forming region 220, it may be necessary to use an anisotropic recess (RIE) process to avoid undercutting into sidewalls 214 when recessing material 210. A collar 222 is then formed along sidewalls 214 by processes known to those skilled in the art, for example by forming a sidewall spacer on sidewalls 214. Material 210 which is doped by forming dopant region 220 is removed during the second recess of material 210.

Figure 8:
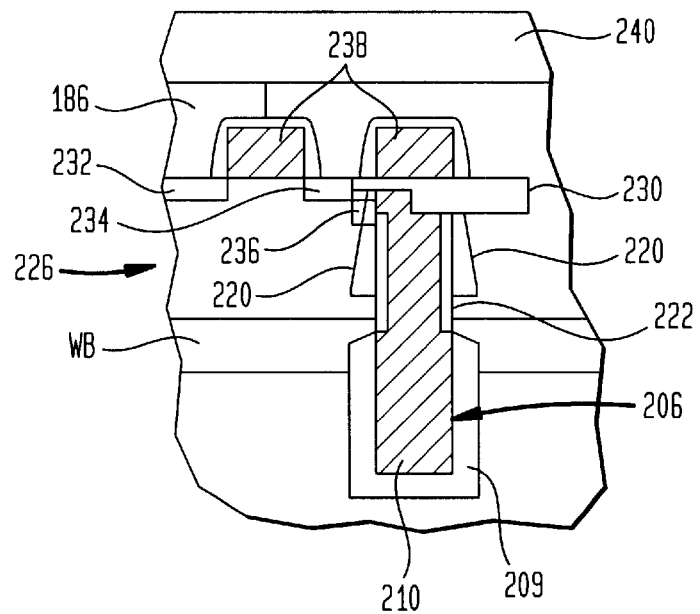
FIG. 8 is a cross-sectional view of a completed trench capacitor cell in accordance with the present invention.

Referring to FIG. 8, in the illustrative embodiments described above, doped region 220 includes a localized p-type doped region which remains below the depth of a buried strap 224, and above a top of collar 222 and a buried well WB. Doped region 220 serves to augment the standard retrograde array p-well profile which includes p-well 226. As noted earlier, dopants of opposite conductivity may be employed provided the dopants of all components needed for proper operation of the device are appropriately designated and formed.

Processing continues as is known in the art. A shallow trench isolation 230 is formed, and diffusion regions are provided including source region 232, drain region 234 and buried strap outdiffusion 236 (node diffusion). Wordlines 238 and bitlines 240 are also formed.

By the present invention, it is desired to create a region of increased doping concentration along the sidewalls of the trench adjacent to a collar region, and below the buried-strap outdiffusion region to augment the high-concentration region of the array p-well above the n-band (WB). The increased doping along with the collar sidewall will suppress the leakage associated with the vertical parasitic device along the collar sidewalls by increasing the threshold voltage for the vertical parasitic transistor, and enable a scaling of the collar oxide to reduced thickness with advanced memory device generations.

The present invention provides a dopant region 220 in the trench sidewall 214 which decreases the doping concentration of the dopant region 220 near the buried strap outdiffusion 236 at the top of collar 222. This advantageously suppresses junction leakage of buried strap outdiffusion 236. The dopant region 220 of the present invention also increases the doping level in the high-concentration region of the array p-well 226 without compensating the n-band (WB) at the base of collar 222. This also advantageously suppresses junction leakage at the n-band WB. The parasitic leakage from the trench is reduced by increasing the threshold voltage of the parasitic transistor which may be formed along the depth of the trench.

Advantageously, the present invention not only reduces the vertical parasitic leakage problem, with decreasing collar thickness, but adds design flexibility to the memory cell. For example, for a lightly doped p-well, as is possible when using an elevated bit-line low level or a negative wordline low level, the invention provides a means for reducing implant damage and associated defects and leakages in diffusion regions 232 and 234 and p-well 226. The invention also improves latch-up immunity with increased local p-well concentration.

Although described in terms of semiconductor memories, the present invention is broader and is applicable to processors, embedded DRAMs, application specific chips or other chips which may include trench capacitors. Further, the present invention is also applicable to vertically disposed transistors or devices having orientations other than those shown in the FIGS, such as trench-sidewall device transistor structures. Having described preferred embodiments for a novel retrograded isolation collar doping to suppress vertical parasitics (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for fabricating a trench capacitor comprising the steps of:

providing a substrate with a trench formed in the substrate, the trench having a buried plate formed adjacent to the trench;

forming a conductive material in the trench;

recessing the conductive material to a first position within the trench;

implanting dopants in sidewalls of the trench such that a dopant region is formed laterally outward from the trench, the dopant region including a profile having a lower portion at about the first position extending further laterally outward from the trench than an upper portion of the profile wherein operation of a parasitic transistor formed adjacent to the trench is disrupted by the dopant region; and forming a dielectric collar and a storage node in the trench.

2. The method as recited in claim 1 wherein the step of implanting dopants includes the step of implanting dopants by one of plasma immersion ion implantation and plasma doping.

3. The method as recited in claim 2 wherein the step of implanting dopants by one of plasma immersion ion implantation and plasma doping includes the step of:

adjusting chamber parameters of a processing chamber, the chamber parameters including at least one of pressure in the chamber, voltage difference between a chamber electrode and the substrate and a geometric orientation of the substrate relative to a dopant source in the chamber.

4. The method as recited in claims 3, wherein the pressure is adjusted to between about 1 mTorr and about 500 mTorr.

5. The method as recited in claim 3, wherein the voltage difference is adjusted to between about 500 volts and about 10,000 volts.

6. The method as recited in claim 3, wherein the geometric orientation includes a tilt angle of between about 3 degrees and about 30 degrees.

7. The method as recited in claim 1 further comprising the steps of forming a node dielectric on the trench sidewalls and stripping the node dielectric above the first position prior to the step of implanting.

8. The method as recited in claim 1 wherein the profile includes a conically shaped diffusion region having an apex at the upper portion.

9. In a trench capacitor cell, which may form a parasitic transistor between a buried plate and a node diffusion which is enabled by charge stored in a storage node, a method for disrupting the parasitic transistor comprising the steps of:

forming a conductive material in the trench;

recessing the conductive material to a first position within the trench; and implanting dopants in sidewalls of the trench such that a dopant region is formed laterally outward from the trench, the dopant region including a profile having a lower portion at about the first position extending further laterally outward from the trench than an upper portion of the profile wherein operation of a parasitic transistor formed adjacent to the trench is disrupted by the dopant region.

10. The method as recited in claim 9, wherein the step of implanting dopants includes the step of implanting dopants by one of plasma immersion ion implantation, plasma doping and angled implantation.

11. The method as recited in claim 9, wherein the step of implanting dopants includes the step of:

adjusting chamber parameters of a processing chamber, the chamber parameters including at least one of pressure in the chamber, voltage difference between a plasma chamber wall and the substrate and a geometric orientation of the substrate relative to a beam line for implant dopants.

12. The method as recited in claims 11, wherein the pressure is adjusted to between about 1 mTorr and about 500 mTorr.

13. The method as recited in claim 11, wherein the voltage difference is adjusted to between about 500 volts and about 10,000 volts.

14. The method as recited in claim 11, wherein the geometric orientation includes a tilt angle of between about 3 degrees and about 30 degrees.

15. The method as recited in claim 9, further comprising the steps of forming a node dielectric on the trench sidewalls and stripping the node dielectric above the first position prior to the step of implanting.

16. The method as recited in claim 9, wherein the profile includes a conically shaped diffusion region having an apex at the upper portion.

17. In a trench capacitor cell, which may form a parasitic transistor between a buried plate and a node diffusion which is enabled by charge stored in a storage node, a method for disrupting the parasitic transistor comprising the steps of:

recessing a trench into a substrate down to a first position within the substrate;

implanting dopants in sidewalls of the trench such that a dopant region is formed laterally outward from the trench, the dopant region including a profile having a lower portion at about the first position extending further laterally outward from the trench than an upper portion of the profile wherein operation of a parasitic transistor formed adjacent to the trench is disrupted by the dopant region; and extending the trench to a second position which is deeper into the substrate.

18. The method as recited in claim 17, wherein the step of implanting dopants includes the step of implanting dopants by one of plasma immersion ion implantation, plasma doping and angled implantation.

19. The method as recited in claim 17, wherein the step of implanting dopants includes the step of:

adjusting chamber parameters of a processing chamber, the chamber parameters including at least one of pressure in the chamber, voltage difference between a plasma chamber wall and the substrate and a geometric orientation of the substrate relative to a beam line for implant dopants.

20. The method as recited in claim 19, wherein the pressure is adjusted to between about 1 mTorr and about 500 mTorr.

21. The method as recited in claim 19, wherein the voltage difference is adjusted to between about 500 volts and about 10,000 volts.

22. The method as recited in claim 19, wherein the geometric orientation includes a tilt angle of between about 3 degrees and about 30 degrees.

23. The method as recited in claim 17, wherein the profile includes a conically shaped diffusion region.

* * * * *